US010665167B2

(12) United States Patent
Fu et al.

(10) Patent No.: US 10,665,167 B2
(45) Date of Patent: *May 26, 2020

(54) PIXEL CIRCUIT INCLUDING STANDBY DRIVING CIRCUIT AND SWITCHING CIRCUIT, AND DRIVING METHOD THEREOF, AND DISPLAY DEVICE TOUCH DISPLAY PANEL

(71) Applicant: BOE TECHNOLOGY GROUP CO., LTD., Beijing (CN)

(72) Inventors: Jie Fu, Beijing (CN); Xiaochuan Chen, Beijing (CN); Shengji Yang, Beijing (CN); Dongni Liu, Beijing (CN); Lei Wang, Beijing (CN); Pengcheng Lu, Beijing (CN); Li Xiao, Beijing (CN); Han Yue, Beijing (CN); Yankai Gao, Beijing (CN); Mingfu Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 79 days.

This patent is subject to a terminal disclaimer.

(21) Appl. No.: 15/769,277

(22) PCT Filed: Sep. 22, 2017

(86) PCT No.: PCT/CN2017/102951
§ 371 (c)(1),
(2) Date: Apr. 18, 2018

(87) PCT Pub. No.: WO2018/113361
PCT Pub. Date: Jun. 28, 2018

(65) Prior Publication Data
US 2019/0080650 A1 Mar. 14, 2019

(30) Foreign Application Priority Data
Dec. 21, 2016 (CN) .......................... 2016 1 1201848

(51) Int. Cl.
*G09G 3/3258* (2016.01)
*G09G 3/3233* (2016.01)
(Continued)

(52) U.S. Cl.
CPC ........... *G09G 3/3258* (2013.01); *G09G 3/006* (2013.01); *G09G 3/3233* (2013.01);
(Continued)

(58) Field of Classification Search
None
See application file for complete search history.

(56) References Cited

U.S. PATENT DOCUMENTS

2004/0066146 A1 4/2004 Park et al.
2007/0236440 A1* 10/2007 Wacyk ................ G09G 3/3233
345/92

(Continued)

FOREIGN PATENT DOCUMENTS

CN        1477610 A    2/2004
CN    103810965 A    5/2014
(Continued)

OTHER PUBLICATIONS

International Search Report and Written Opinion of the International Search Authority in corresponding International Patent Application No. PCT/CN2017/102951 dated Dec. 27, 2017. English translation attached. 22 pages.
(Continued)

*Primary Examiner* — David D Davis
(74) *Attorney, Agent, or Firm* — Leason Ellis LLP

(57) ABSTRACT

A pixel circuit and a driving method, a display device. The pixel circuit includes: a main driving circuit, configured to, under control of a scanning signal line and a data signal line, output a main driving current signal to a fusing circuit; the fusing circuit configured to enable a light emitting circuit
(Continued)

and the main driving circuit to be disconnected from each other; a fusing control circuit configured to, under control of a signal input terminal, enable the light emitting circuit and the main driving circuit to be disconnected from each other; a standby driving circuit configured to output a standby driving current signal to a switching circuit; the switching circuit configured to, under control of an input signal of a control line, connect the standby driving circuit to the light emitting circuit; and the light emitting circuit configured to emit light by using the standby driving current signal.

20 Claims, 7 Drawing Sheets

(51) Int. Cl.
  *G09G 3/00*      (2006.01)
  *G09G 3/3266*    (2016.01)
  *G09G 3/3291*    (2016.01)
  *H01L 27/32*     (2006.01)

(52) U.S. Cl.
  CPC ......... *G09G 3/3266* (2013.01); *G09G 3/3291* (2013.01); *H01L 27/3276* (2013.01); *G09G 2300/0426* (2013.01); *G09G 2300/0439* (2013.01); *G09G 2300/0819* (2013.01); *G09G 2300/0842* (2013.01); *G09G 2330/12* (2013.01)

(56) References Cited

U.S. PATENT DOCUMENTS

| | | | |
|---|---|---|---|
| 2008/0116501 | A1 | 5/2008 | Lin et al. |
| 2015/0108437 | A1 | 4/2015 | Cho et al. |
| 2015/0138171 | A1* | 5/2015 | Kim .................... H01L 27/3223 |
| | | | 345/205 |
| 2015/0213756 | A1* | 7/2015 | Wacyk ................. G09G 3/3225 |
| | | | 345/690 |
| 2016/0268364 | A1 | 9/2016 | Yin et al. |
| 2019/0012965 | A1* | 1/2019 | Fu ........................ G09G 3/3258 |

FOREIGN PATENT DOCUMENTS

| | | |
|---|---|---|
| CN | 104576686 A | 4/2015 |
| CN | 104637450 A | 5/2015 |
| CN | 104659058 A | 5/2015 |
| CN | 106531079 A | 3/2017 |
| CN | 106782318 A | 5/2017 |
| CN | 206271396 U | 6/2017 |
| CN | 206282593 U | 6/2017 |
| JP | 2009003009 A | 1/2009 |
| JP | 2011164219 A | 8/2011 |

OTHER PUBLICATIONS

International Search Report and Written Opinion in corresponding International Patent Application No. PCT/CN2017/097756 dated Oct. 26, 2017. 21 pages.

* cited by examiner

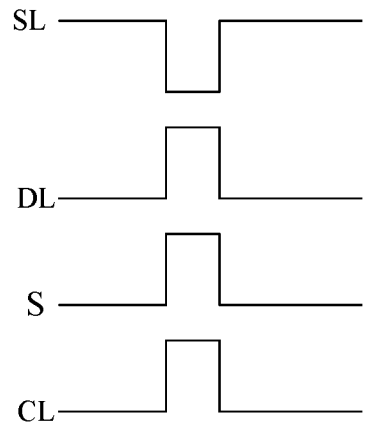

FIG. 7b

When testing the pixel circuit, inputting a scanning signal to a scanning signal line SL, inputting a turn-off signal to a data signal line DL, and inputting a fourth signal to a signal input terminal S, so that when a main driving circuit 10 outputs a main driving current signal, a light emitting circuit 30 and the main driving circuit 10 are disconnected from each other — S10

If the emitting circuit 30 and the main driving circuit 10 are disconnected from each other, inputting a second signal to the control line CL, so that the light emitting circuit 30 and the standby driving circuit 20 are connected with each other; and if the light emitting circuit 30 and the main driving circuit 10 still remain connected, inputting a first signal to the control line CL, so that the light emitting circuit 30 and the standby driving circuit 20 remain disconnected — S20

During normal operation of the pixel circuit, inputting the scanning signal to the scanning signal line SL, inputting a data signal to the data signal line DL, and inputting a third signal to the signal input terminal S, so that the main driving current signal output by the main driving circuit 10 or the standby driving current signal output by the standby driving circuit 20 drives the light emitting circuit 30 to emit light — S30

FIG. 8

PIXEL CIRCUIT INCLUDING STANDBY DRIVING CIRCUIT AND SWITCHING CIRCUIT, AND DRIVING METHOD THEREOF, AND DISPLAY DEVICE TOUCH DISPLAY PANEL

CROSS-REFERENCE TO RELATED PATENT APPLICATIONS

This application is a U.S. National Phase Application under 35 U.S.C. § 371 of International Patent Application No. PCT/CN2017/102951, filed Sep. 22, 2017, and claims the priority of Chinese Application No. 201611201848.6, filed Dec. 21, 2016, all of which are incorporated by reference in their entireties.

TECHNICAL FIELD

Embodiments of the present disclosure relate to a pixel circuit and a driving method thereof, and a display device.

BACKGROUND

An organic light emitting diode (OLED) has advantages such as self-illumination, high contrast, wide color gamut, a simple manufacture process and easy formation of a flexible structure. Therefore, a display technology using the organic light emitting diode has become an important display technology.

For example, an Active Matrix Organic Light Emitting Diode (AMOLED) has a great development potential due to advantages such as no viewing angle limitation, a low fabrication cost, a fast response speed and power conservation.

However, a current OLED display panel has a high probability of occurrence of bright spots due to problems in design and process stability, while there is almost zero tolerance of the bright spot problem in many fields of application.

At present, a method for solving the bright spot problem is mainly scanning bright spots in the panel through a device, and turning off a pixel point by using a laser cutting solution after a position of the bright spot is determined. However, the solution is inefficient and impairs the pixel, which may affect the panel quality and yield rate. Moreover, when a size of the pixel is reduced to a nanometer level, it is impossible to repair the pixel by using a laser repair method. In addition, the bright spot after being repaired becomes a dark spot, and the number of dead pixels in the panel increases, resulting in a further decrease in the panel yield rate and quality.

SUMMARY

In a first aspect, embodiments of the disclosure provide a pixel circuit, comprising: a main driving circuit, a standby driving circuit, a light emitting circuit, a fusing circuit, a fusing control circuit, and a switching circuit.

For example, the main driving circuit is respectively connected with a scanning signal line, a data signal line, a first voltage terminal and the fusing circuit, and is configured to, under control of the scanning signal line and the data signal line, convert a voltage signal input by the first voltage terminal into a main driving current signal, and output the main driving current signal to the fusing circuit.

The fusing circuit is further connected with the fusing control circuit and the light emitting circuit, and is configured to, under control of the fusing control circuit, enable the light emitting circuit and the main driving circuit to be disconnected from each other.

The fusing control circuit is further connected with a signal input terminal and a ground terminal, and is configured to, under control of the signal input terminal, enable the main driving current signal, which is output from the main driving circuit to the fusing circuit, to flow to the ground terminal, so that the light emitting circuit and the main driving circuit are disconnected from each other.

The standby driving circuit is respectively connected with the scanning signal line, the data signal line, the first voltage terminal and the switching circuit, and is configured to, under control of the scanning signal line and the data signal line, convert the voltage signal input by the first voltage terminal into a standby driving current signal, and output the standby driving current signal to the switching circuit.

The switching circuit is further connected with the light emitting circuit and a control line, and is configured to, under control of an input signal of the control line, connect the standby driving circuit to the light emitting circuit.

The light emitting circuit is further connected with a second voltage terminal, and is configured to, under control of the second voltage terminal, emit light by using the standby driving current signal output by the standby driving circuit when the light emitting circuit and the main driving circuit are disconnected from each other.

For example, the light emitting circuit is further configured to: under the control of the second voltage terminal, emit light via the main driving current signal output by the main driving circuit before the light emitting circuit and the main driving circuit are disconnected from each other.

For example, the pixel circuit further comprises a switching control circuit, respectively connected with the control line, the main driving circuit, the fusing circuit, a third voltage terminal, a fourth voltage terminal and the signal input terminal, wherein the switching control circuit is configured to, under control of the third voltage terminal, the fourth voltage terminal and the signal input terminal: input the second signal to the control line when the fusing circuit enables the light emitting circuit and the main driving circuit to be disconnected from each other, so that the light emitting circuit and the standby driving circuit are connected with each other; otherwise, input the first signal to the control line when the light emitting circuit and the standby driving circuit remain disconnected.

For example, the switching control circuit includes a first switching control transistor, a second switching control transistor, a third switching control transistor, and a switching control fusing element. A gate electrode and a first electrode of the first switching control transistor are connected with the third voltage terminal, and a second electrode is connected with one end of the switching control fusing element; another end of the switching control fusing element is connected with both a first electrode of the second switching control transistor and the control line. A gate electrode and a second electrode of the second switching control transistor are both connected with the fourth voltage terminal. A gate electrode of the third switching control transistor is connected with the signal input terminal, a first electrode is connected with the first electrode of the second switching control transistor, and a second electrode is connected with both the main driving circuit and the fusing circuit. A width-to-length ratio of the first switching control transistor is 10 times or more of a width-to-length ratio of the second switching control transistor; and the first switching control transistor and the second switching control transistor are constantly on, the first switching control transistor is a P-type transistor, the second switching control transistor and the third switching control transistor are N-type transistors; or, the first switching control transistor is an N-type transistor, and the second switching control transistor and the third switching control transistor are P-type transistors.

For example, the main driving circuit includes a first transistor, a second transistor and a first storage capacitor. A gate electrode of the first transistor is connected with the scanning signal line, a first electrode is connected with the data signal line, and a second electrode is connected with a gate electrode of the second transistor. A first electrode of the second transistor is connected with the first voltage terminal, and a second electrode is connected with the fusing circuit. One end of the first storage capacitor is connected with the gate electrode of the second transistor, another end of the first storage capacitor is connected with the second electrode of the second transistor, or, the other end of the first storage capacitor is connected with the first electrode of the second transistor.

For example, the standby driving circuit includes a third transistor, a fourth transistor and a second storage capacitor. A gate electrode of the third transistor is connected with the scanning signal line, a first electrode is connected with the data signal line, and a second electrode is connected with a gate electrode of the fourth transistor. A first electrode of the fourth transistor is connected with the first voltage terminal, and a second electrode is connected with the switching circuit. One end of the second storage capacitor is connected with the gate electrode of the fourth transistor, another end of the second storage capacitor is connected with the second electrode of the fourth transistor, or, the other end of the second storage capacitor is connected with the first electrode of the fourth transistor.

For example, the fusing circuit includes a first fusing element. One end of the first fusing element is connected with the main driving circuit, and another end of the first fusing element is connected with both the light emitting circuit and the fusing control circuit.

For example, the fusing control circuit includes a fifth transistor; a gate electrode of the fifth transistor is connected with the signal input terminal, a first electrode is connected with the fusing circuit, and a second electrode is connected with the ground terminal.

For example, the switching circuit includes a sixth transistor; a gate electrode of the sixth transistor is connected with the control line, a first electrode is connected with the standby driving circuit, and a second electrode is connected with the light emitting circuit.

For example, the light emitting circuit includes a light emitting device; an anode of the light emitting device is connected with both the fusing circuit and the switching circuit, and a cathode is connected with the second voltage terminal.

In a second aspect, embodiments of the disclosure provides a display device, comprising the pixel circuit described above.

In a third aspect, embodiments of the disclosure provides a driving method of a pixel circuit, for driving the pixel circuit described above, comprising:

when testing the pixel circuit, inputting a scanning signal to a scanning signal line, inputting a turn-off signal to a data signal line, and inputting a fourth signal to a signal input terminal, so that when a main driving circuit outputs a main driving current signal, a light emitting circuit and the main driving circuit are disconnected from each other;

if the emitting circuit and the main driving circuit are disconnected from each other, inputting a second signal to the control line, so that the light emitting circuit and the standby driving circuit are connected with each other; and if the light emitting circuit and the main driving circuit remain connected, inputting a first signal to the control line, so that the light emitting circuit and the standby driving circuit remain disconnected;

during normal operation of the pixel circuit, inputting the scanning signal to the scanning signal line, inputting a data signal to the data signal line, and inputting a third signal to the signal input terminal, so that the main driving current signal output by the main driving circuit or the standby driving current signal output by the standby driving circuit drives the light emitting circuit to emit light.

For example, inputting the first signal or the second signal to the control line, includes: under control of a third voltage terminal and a fourth voltage terminal, when the signal input terminal is input with the fourth signal, inputting, by a switching control circuit, the second signal to the control line if the pixel circuit has an always-on defect, otherwise, inputting, by the switching control circuit, the first signal to the control line; and when the signal input terminal is input with the third signal, inputting, by the switching control circuit, the second signal to the control line if the light emitting circuit and the main driving circuit are disconnected from each other, otherwise, inputting, by the switching control circuit, the first signal to the control line.

Embodiments of the present disclosure provides a pixel circuit, a driving method and a display device; by inputting a scanning signal to the scanning signal line, inputting a turn-off signal to the data signal line, and under control of the signal input terminal, if the pixel circuit has an always-on defect, the main driving current signal, which is output from the main driving circuit to the fusing circuit, flows to the ground terminal, and the light emitting circuit and the main driving circuit are disconnected from each other, so as to solve the problem of the always-on defect. If the pixel circuit has no always-on defect, when the data signal line is input with the turn-off signal, the main driving circuit does not output any driving current signal, and the light emitting circuit and the main driving circuit remain connected. The main driving circuit still drives the light emitting circuit to emit light. If the pixel circuit has the always-on defect, the light emitting circuit and the main driving circuit are disconnected from each other, and the light emitting circuit may be connected with the standby driving circuit under the control of the control line, so that the standby driving circuit drives the light emitting circuit to emit light. When the pixel circuit operates normally, the scanning signal line is input with the scanning signal, the data signal line is input with the data signal; and the main driving current signal output by the main driving circuit or the standby driving current signal output by the standby driving circuit may drive the light emitting circuit to emit light. Based on this, it can be seen that, in embodiments of the present disclosure, pixels are not damaged on the basis that the problem of the always-on defect is solved; in addition, an objective of repairing the pixel circuits is achieved, which prevents the always-on defect from affecting the product quality and yield rate.

BRIEF DESCRIPTION OF THE DRAWINGS

In order to illustrate the technical solutions in the embodiments of the present disclosure or the existing arts more clearly, the drawings needed to be used in the description of the embodiments or the existing arts will be briefly described in the following; it is obvious that the drawings described below are only related to some embodiments of the present disclosure, for one ordinary skilled person in the art, other drawings can be obtained according to these drawings without making other inventive work.

FIG. 7b is a second timing diagram of a pixel circuit during normal operation; and FIG. 8 is a flow chart of a driving method of a pixel circuit provided by an embodiment of the present disclosure.

DETAILED DESCRIPTION

Hereafter, the technical solutions of the embodiments of the present disclosure will be described in a clearly and fully understandable way in connection with the drawings related to the embodiments of the disclosure. It is obvious that the described embodiments are just a part but not all of the embodiments of the present disclosure. Based on embodiments of the present disclosure, all other embodiments obtained by those skilled in the art without making other inventive work should be within the scope of the present disclosure.

Figure 1:
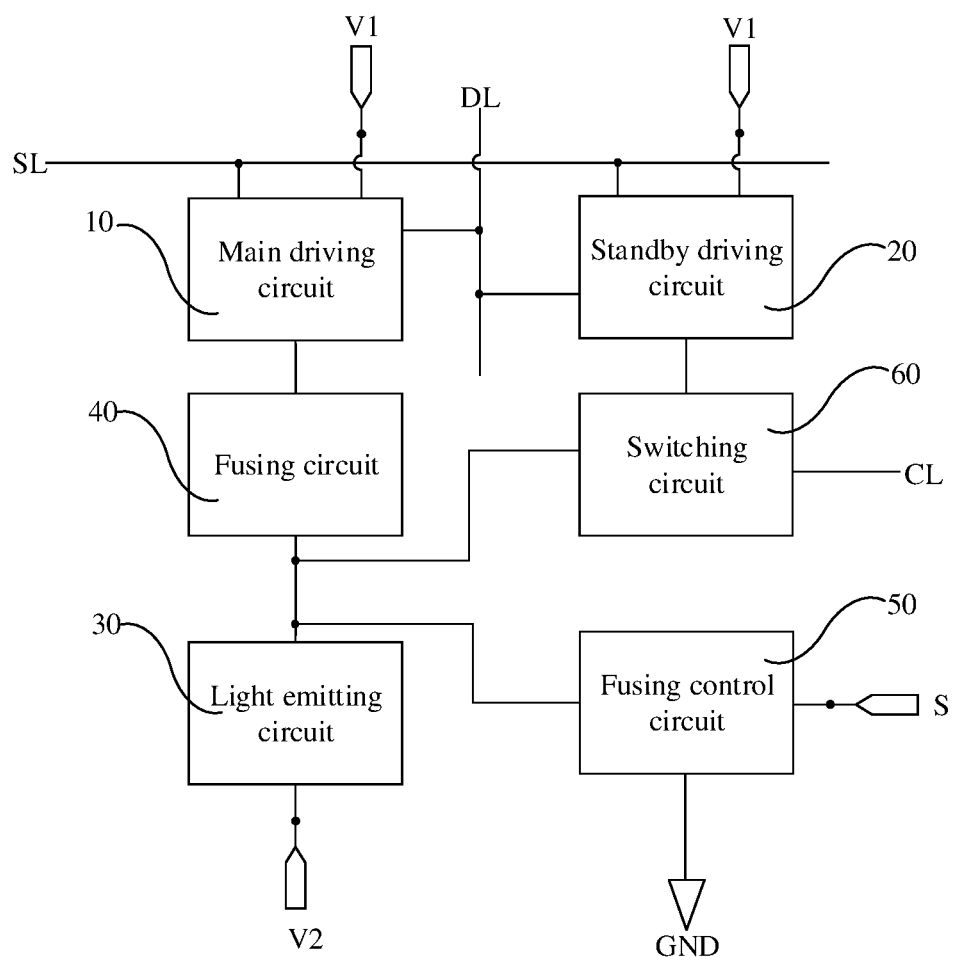
FIG. 1 is a first structural schematic diagram of a pixel circuit provided by an embodiment of the present disclosure.

An embodiment of the present disclosure provides a pixel circuit, which, as shown in FIG. 1, comprises: a main driving circuit 10, a standby driving circuit 20, a light emitting circuit 30, a fusing circuit 40, a fusing control circuit 50 and a switching circuit 60.

For example, the main driving circuit 10 is respectively connected with a scanning signal line SL, a data signal line DL, a first voltage terminal V1 and a fusing circuit 40, and is configured to convert a voltage signal input by the first voltage terminal V1 into a main driving current signal, and output the main driving current signal to the fusing circuit 40, under control of the scanning signal line SL and the data signal line DL.

The fusing circuit 40 is further connected with the fusing control circuit 50 and the light emitting circuit 30, and is configured to enable the light emitting circuit 30 and the main driving circuit 10 to be disconnected from each other, under control of the fusing control circuit 50.

The fusing control circuit 50 is further connected with a signal input terminal S and a ground terminal GND, and is configured to enable the main driving current signal, which is output from the main driving circuit 10 to the fusing circuit 40, to flow to the ground terminal GND, under control of the signal input terminal S, so that the light emitting circuit 30 and the main driving circuit 10 are disconnected from each other.

The standby driving circuit 20 is respectively connected with the scanning signal line SL, the data signal line DL, the first voltage terminal V1 and the switching circuit 60, and is configured to convert the voltage signal input by the first voltage terminal V1 into a standby driving current signal, and output the standby driving current signal to the switching circuit 60, under control of the scanning signal line SL and the data signal line DL.

The switching circuit 60 is further connected with the light emitting circuit 30 and a control line CL, and is configured to connect the standby driving circuit 20 to the light emitting circuit 30, under control of an input signal of the control line CL.

The light emitting circuit 30 is further connected with a second voltage terminal V2, and is configured to: emit light via the standby driving current signal output by the standby driving circuit 20 under control of the second voltage terminal V2, when the light emitting circuit 30 and the main driving circuit 10 are disconnected from each other.

The light emitting circuit 30 is further configured to: emit light by using the main driving current signal output by the main driving circuit 10 under the control of the second voltage terminal V2, before the light emitting circuit 30 and the main driving circuit 10 are disconnected from each other (i.e., when the light emitting circuit 30 and the main driving circuit 10 remain connected).

An operation mode of the pixel circuit according to an embodiment of the present disclosure includes that: when the pixel circuit operates normally, a driving current signal output by the main driving circuit 10 flows to the light emitting circuit 30 through the fusing circuit 40, to drive the light emitting circuit 30 to emit light. In this case, the control line CL is input with a first signal, so that the light emitting circuit 30 and the standby driving circuit 20 remain disconnected, and at a same time, the signal input terminal S is input with a third signal, so that the light emitting circuit 30 and the main driving circuit 10 remain connected.

When the pixel circuit has an always-on defect, the signal input terminal S is input with a fourth signal, to enable the main driving current signal, which is output from the main driving circuit 10 to the fusing circuit 40, to flow to the ground terminal, so that the light emitting circuit 30 and the main driving circuit 10 are disconnected from each other. In this case, the control line CL is input with a second signal, to make the light emitting circuit 30 and the standby driving circuit 20 be connected with each other. Based on this, the standby driving current signal output by the standby driving circuit 20 may flow to the light emitting circuit 30, to drive the light emitting circuit 30 to emit light.

It should be noted that, firstly, with respect to the fusing circuit 40, once the light emitting circuit 30 and the main driving circuit 10 are disconnected from each other under the control of the fusing control circuit 50, the light emitting circuit 30 and the main driving circuit 10 cannot restore to the connected status again.

Secondly, the first voltage terminal V1 may be connected with a power supply voltage terminal Vdd. The second voltage terminal V2 may be connected with a low voltage terminal or the ground terminal GND.

An embodiment of the present disclosure provides a pixel circuit; by inputting a scanning signal to the scanning signal line SL, inputting a turn-off signal to the data signal line DL, and under control of the signal input terminal S, if the pixel circuit has an always-on defect, the main driving current signal, which is output from the main driving circuit 10 to the fusing circuit 40, flows to the ground terminal GND, and the light emitting circuit 30 and the main driving circuit 10 are disconnected from each other, so as to solve the problem of the always-on defect. If the pixel circuit has no always-on defect, when the data signal line DL is input with the turn-off signal, the main driving circuit 10 does not output any driving current signal, and the light emitting circuit 30 and the main driving circuit 10 remain connected. The main driving circuit 10 still drives the light emitting circuit 30 to emit light. If the pixel circuit has the always-on defect, the light emitting circuit 30 and the main driving circuit 10 are disconnected from each other, and the light emitting circuit 30 may be connected with the standby driving circuit 20 under the control of the control line CL, so that the standby driving circuit 20 drives the light emitting circuit 30 to emit light. When the pixel circuit operates normally, the scanning signal line SL is input with the scanning signal, the data signal line DL is input with the data signal; and the main driving current signal output by the main driving circuit 10 or the standby driving current signal output by the standby driving circuit 20 may drive the light emitting circuit 30 to emit light. Based on this, it can be seen that, in an embodiment of the present disclosure, pixels are not damaged on the basis that the problem of the always-on defect is solved; in addition, an objective of repairing the pixel circuits is achieved, which prevents the always-on defect from affecting the product quality and yield rate.

Figure 2:
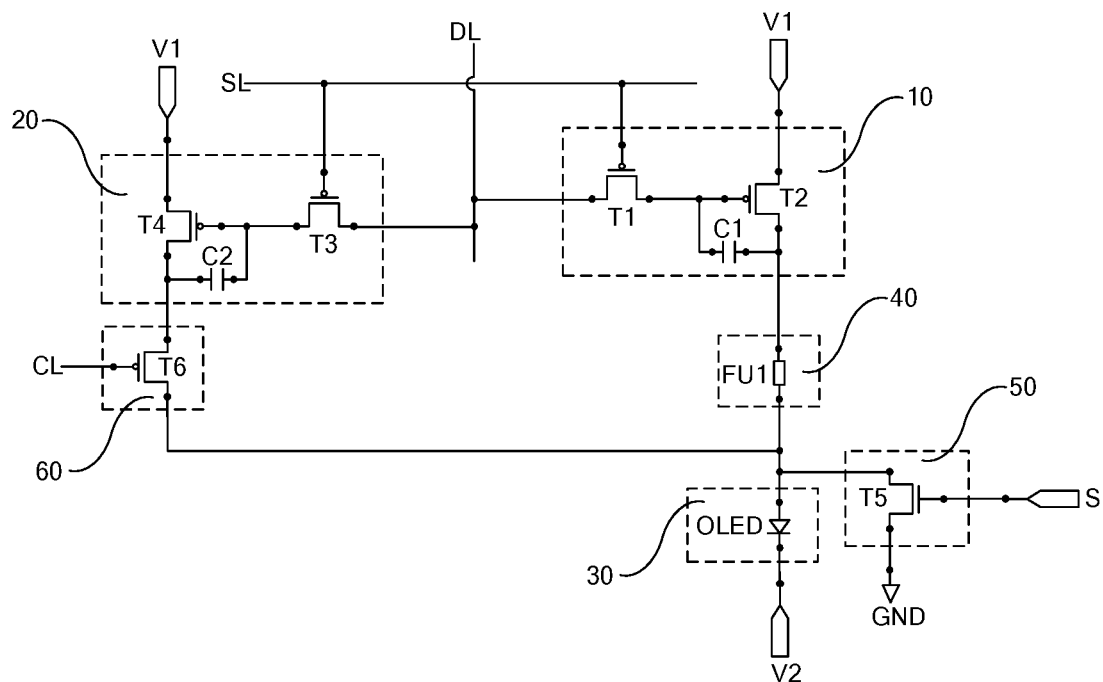
FIG. 2 is a first exemplary structural schematic diagram of respective sub-circuits of the pixel circuit shown in FIG. 1.
Figure 3:
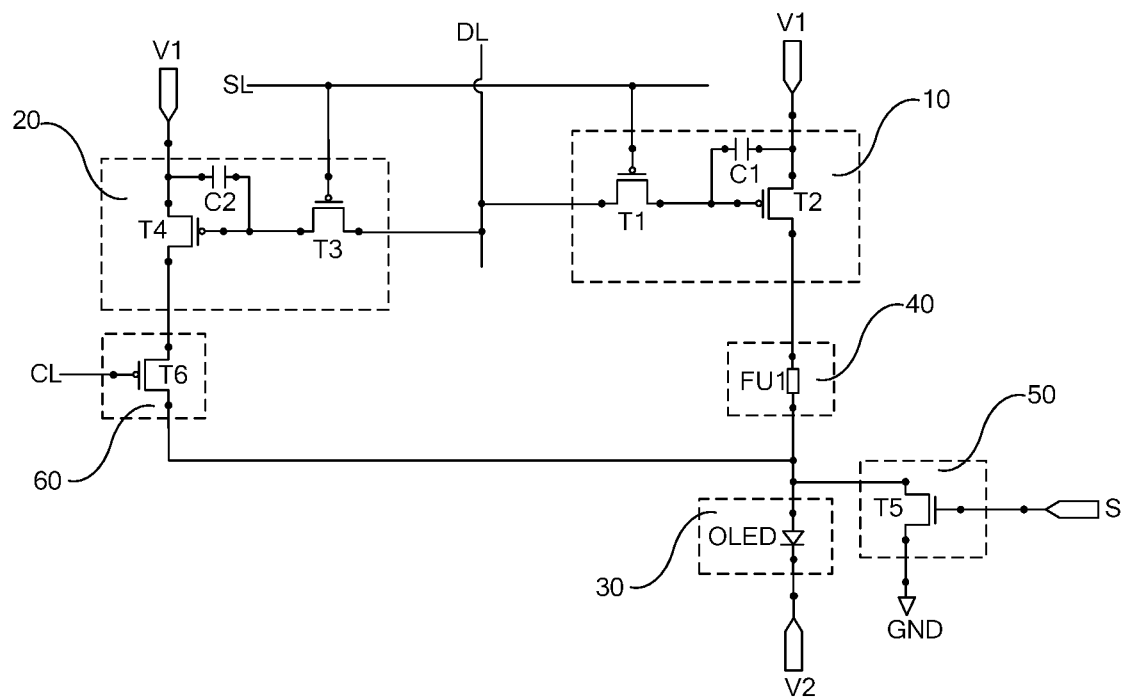
FIG. 3 is a second structural schematic diagram of respective sub-circuits of the pixel circuit shown in FIG. 1.

As shown in FIG. 2 and FIG. 3, the main driving circuit 10 includes a first transistor T1, a second transistor T2 and a first storage capacitor C1. The first transistor T1, the second transistor T2 and the first storage capacitor C1 may also be respectively referred to as a first main driving transistor, a second main driving transistor, and a main storage capacitor.

For example, a gate electrode of the first transistor T1 is connected with the scanning signal line SL, a first electrode is connected with the data signal line DL, and a second electrode is connected with a gate electrode of the second transistor T2.

A first electrode of the second transistor T2 is connected with the first voltage terminal V1, and a second electrode is connected with the fusing circuit 40.

One end of the first storage capacitor C1 is connected with the gate electrode of the second transistor T2, the other end is connected with the second electrode of the second transistor T2 (as shown in FIG. 2), or, the other end is connected with the first electrode of the second transistor T2 (as shown in FIG. 3).

Here, the second transistor T2 is a driving transistor, and the first transistor T1 is a switching transistor.

It should be noted that, the main driving circuit 10 may further include a plurality of switching transistors connected in parallel with the first transistor T1, and/or may further include a plurality of driving transistors connected in parallel with the second transistor T2. The above description is merely illustration of the main driving circuit 10, and other structures that have same functions as those of the main driving circuit 10 will not be described in detail herein, but they should all fall within the protection scope of the present disclosure.

As shown in FIG. 2 and FIG. 3, the standby driving circuit 20 includes a third transistor T3, a fourth transistor T4 and a second storage capacitor C2. The third transistor T3, the fourth transistor T4 and the second storage capacitor C2 may also be respectively referred to as a first standby driving transistor, a second standby driving transistor and a standby storage capacitor.

A gate electrode of the third transistor T3 is connected with the scanning signal line SL, a first electrode is connected with the data signal line DL, and a second electrode is connected with a gate electrode of the fourth transistor T4.

A first electrode of the fourth transistor T4 is connected with the first voltage terminal V1, and a second electrode is connected with the switching circuit 60.

One end of the second storage capacitor C2 is connected with the gate electrode of the fourth transistor T4, the other end is connected with the second electrode of the fourth transistor T4, or, the other end is connected with the first electrode of the fourth transistor T4.

Here, the fourth transistor T4 is a driving transistor and the third transistor T3 is a switching transistor.

It should be noted that, the standby driving circuit 20 may further include a plurality of switching transistors connected in parallel with the third transistor T3, and/or, may further include a plurality of driving transistors connected in parallel with the fourth transistor T4. The above description is merely illustration of the standby driving circuit 20, and other structures that have same functions as those of the standby driving circuit 20 will not be described in detail herein, but they should all fall within the protection scope of the present disclosure.

As shown in FIG. 2 and FIG. 3, the fusing circuit 40 includes a first fusing element FU1; the first fusing element FU1 may include a fuse wire, or a fuse tube, or the like, for example, an element that implements a fusing function through voltage variation.

For example, one end of the first fusing element FU1 is connected with the main driving circuit 10, and the other end is connected with both the light emitting circuit 30 and the fusing control circuit 50. When the main driving circuit 10 has the above-described structure, one end of the first fusing element FU1 is connected with the second electrode of the second transistor T2.

It should be noted that, the above description is merely illustration of the fusing circuit 40, and other structures that have same functions as those of the fusing circuit 40 will not be described in detail herein, but they should all fall within the protection scope of the present disclosure.

As shown in FIG. 2 and FIG. 3, the fusing control circuit 50 includes a fifth transistor T5. The fifth transistor T5 may also be referred to as a fusing control transistor.

For example, a gate electrode of the fifth transistor T5 is connected with the signal input terminal S, a first electrode is connected with the fusing circuit 40, and a second electrode is connected with the ground terminal GND. When the fusing circuit 40 has the above-described structure, the first electrode of the third transistor T5 is connected with the other end of the first fusing element FU1.

It should be noted that, the fusing control circuit 50 may further include a plurality of switching transistors connected in parallel with the fifth transistor T5. The above description is merely illustration of the fusing control circuit 50, and other structures that have same functions as those of the fusing control circuit 50 will not be described in detail herein, but they should all fall within the protection scope of the present disclosure.

As shown in FIG. 2 and FIG. 3, the switching circuit 60 includes a sixth transistor T6. The sixth transistor T6 may also be referred to as a switching transistor.

A gate electrode of the sixth transistor T6 is connected with the control line CL, a first electrode is connected with the standby driving circuit 20, and a second electrode is connected with the light emitting circuit 30. When the standby driving circuit 10 has the above-described structures, the first electrode of the sixth transistor T6 is connected with the second electrode of the fourth transistor T4.

It should be noted that, the switching circuit 60 may further include a plurality of switching transistors connected in parallel with the sixth transistor T6. The above description is merely illustration of the switching circuit 60, and other structures that have same functions as those of the switching circuit 60 will not be described in detail herein, but they should all fall within the protection scope of the present disclosure.

The light emitting circuit 30 includes a light emitting device. In FIG. 2 and FIG. 3, the light emitting circuit 30 is shown with an organic light emitting diode (OLED) as an example.

An anode of the light emitting device 30 is connected with both the fusing circuit 40 and the switching circuit 60, and a cathode is connected with the second voltage terminal V2. When the fusing circuit 40 and the switching circuit 60 have the above-described structures, the anode of the light emitting device is connected with both the other end of the first fusing element FU1 and the second electrode of the sixth transistor T6.

It should be noted that, the light emitting device is not limited to the OLED, but may also be various current-driven light emitting devices including a light emitting diode (LED).

Figure 4:
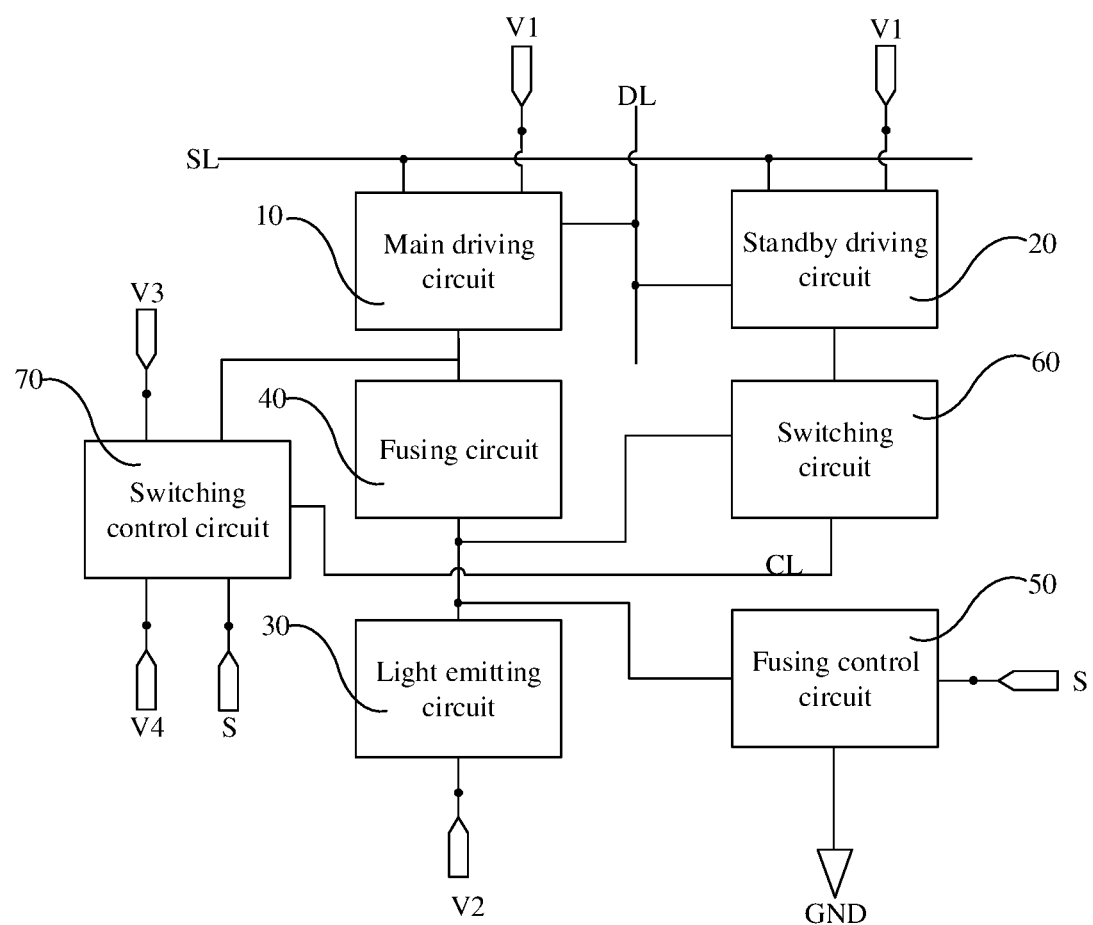
FIG. 4 is a second structural schematic diagram of a pixel circuit provided by an embodiment of the present disclosure.

Based on the above-described FIG. 1 to FIG. 3, as shown in FIG. 4, the pixel circuit further comprises a switching control circuit 70, respectively connected with the control line CL, the main driving circuit 10, the fusing circuit 40, a third voltage terminal V3, a fourth voltage terminal V4 and the signal input terminal S. The switching control circuit 70 is configured to: under control of the third voltage terminal V3, the fourth voltage terminal V4 and the signal input terminal S, input the second signal to the control line CL when the fusing circuit 40 enables the light emitting circuit 30 and the main driving circuit 10 to be disconnected from each other, so that the light emitting circuit 30 and the standby driving circuit 20 are connected with each other; and input the first signal to the control line CL when the light emitting circuit 30 and the main driving circuit 10 remain connected, so that the light emitting circuit 30 and the standby driving circuit 20 remain disconnected.

That is, when the scanning signal line SL is input with the scanning signal, the data signal line DL is input with the turn-off signal, and the signal input terminal S is input with a fourth signal, in this case, if the pixel circuit has the always-on defect, the main driving circuit 10 outputs the main driving current signal, and the main driving current signal outputted by the main driving circuit 10 flows to the ground terminal GND, so that the light emitting circuit 30 and the main driving circuit 10 are disconnected from each other (for example, the fusing element FU1 of the fusing circuit 40 is disconnected), so as to solve the problem of the always-on defect due to the main driving circuit 10.

Based on this, under control of the third voltage terminal V3, the fourth voltage terminal V4 and a fourth signal input by the signal input terminal S, since a portion of the current output by the main driving circuit 10 flows to the switching control circuit 70, causing a voltage to be applied to the switching control circuit 70, the switching control circuit 70 inputs the second signal to the control line CL, so that the light emitting circuit 30 and the standby driving circuit 20 are connected with each other, and the standby driving circuit 20 drives the light emitting circuit 30 to emit light. For example, in order to ensure that, after the main driving circuit 10 and the light emitting circuit 30 are disconnected from each other, the standby driving circuit 20 drives the light emitting circuit 30 to emit light, the control line CL needs to continuously input the second signal.

On this basis, when the scanning signal line SL is input with the scanning signal, the data signal line DL is input with the data signal, and the signal input terminal S is input with the third signal, it can be ensured that the standby driving circuit 20 drives the light emitting circuit 30 to emit light.

When the scanning signal line SL is input with the scanning signal, the data signal line DL is input with the turn-off signal, and the signal input terminal S is input with the fourth signal, if the always-on defect does not exist, the main driving circuit 10 does not output the main driving current signal. At this point, even if the signal input terminal S is input with the fourth signal, since the main driving circuit 10 still does not output a driving current signal, the fusing circuit 40 is not affected, and the light emitting circuit 30 and the main driving circuit 10 are still connected with each other via the fusing circuit 40.

Based on this, under the control of the third voltage terminal V3, the fourth voltage terminal V4 and the fourth signal input by the signal input terminal S, the switching control circuit 70 inputs the first signal to the control line CL, to make the light emitting circuit 30 and the standby driving circuit 20 remain disconnected.

On this basis, when the scanning signal line SL is input with the scanning signal, the data signal line DL is input with the data signal, the signal input terminal S is input with the third signal, and the control line CL is input with the first signal, it can be ensured that the main driving circuit 10 drives the light emitting circuit 30 to emit light.

In an embodiment of the present disclosure, the switching control circuit 70 is provided in the pixel circuit, and is connected with the control line CL, the main driving circuit 10, the fusing circuit 40, the third voltage terminal V3, the fourth voltage terminal V4 and the signal input terminal S; when the signal input terminal S is input with the fourth signal, if the fusing circuit 40 enables the light emitting circuit 30 and the main driving circuit 10 to be disconnected from each other, then under control of the third voltage terminal V3 and the fourth voltage terminal V4, and under an action of the main driving circuit 10, the second signal is input to the control line CL, to achieve an objective that when the light emitting circuit 30 and the main driving circuit 10 are disconnected from each other, the light emitting circuit 30 and the standby driving circuit 20 are automatically made to be connected; and when the signal input terminal S is input with the fourth signal, it does not affect the fusing circuit 40, or when the signal input terminal S is input with the third signal, normal operation of the pixel circuit can be ensured.

Figure 5:
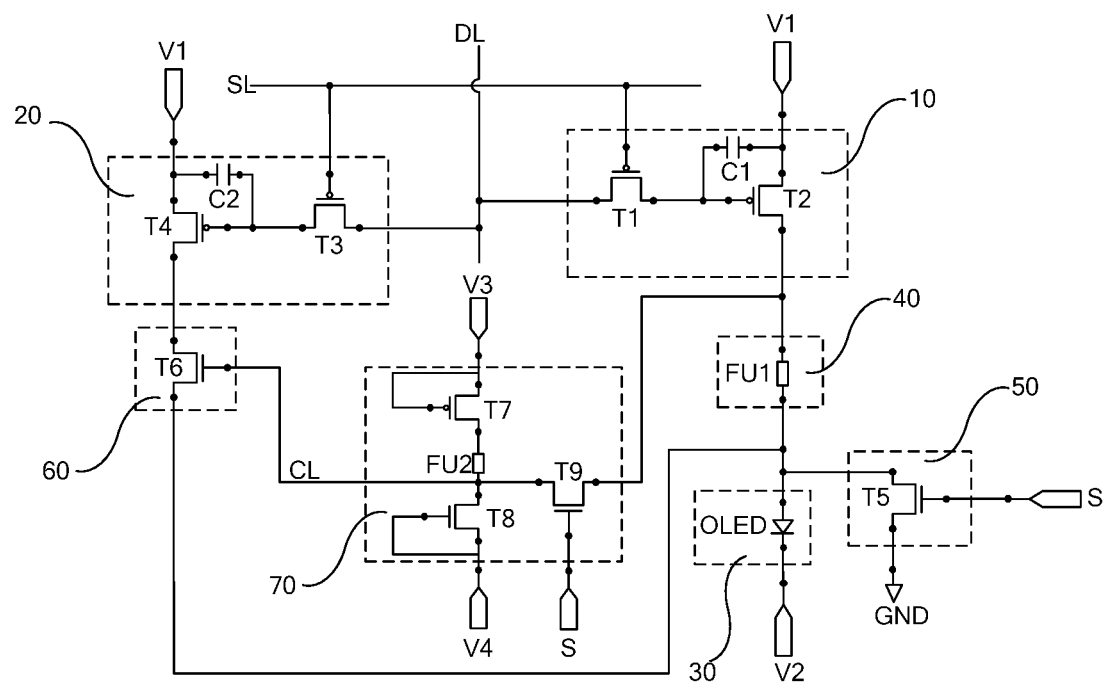
FIG. 5 is an exemplary structural schematic diagram of respective sub-circuits of the pixel circuit shown in FIG. 4.

Further, for example, as shown in FIG. 5, the switching control circuit 70 includes a first switching control transistor T7, a second switching control transistor T8, a third switching control transistor T9, and a switching control fusing element FU2.

For example, a gate electrode and a first electrode of the first switching control transistor T7 are connected with the third voltage terminal V3, and a second electrode is connected with one end of the switching control fusing element FU2.

The other end of the switching control fusing element FU2 is connected with both a first electrode of the second switching control transistor T8 and the control line CL.

A gate electrode and a second electrode of the second switching control transistor T8 are both connected with the fourth voltage terminal V4.

A gate electrode of the third switching control transistor T9 is connected with the signal input terminal S, a first electrode is connected with a first electrode of the second switching control transistor T8, and a second electrode is connected with both the main driving circuit 10 and the fusing circuit 40. When the main driving circuit 10 and the fusing circuit 40 have the above-described structures, the second electrode of the third switching control transistor T9 is connected with both the second electrode of the second transistor T2 and one end of the first fusing element FU1.

For example, a width-to-length ratio of the first switching control transistor T7 is 10 times or more of a width-to-length ratio of the second switching control transistor T8; the first switching control transistor T7 and the second switching control transistor T8 are constantly on (for example, the first switching control transistor T7 and the second switching control transistor T8 are constantly turned on), the first switching control transistor T7 is a P-type transistor, the second switching control transistor T8 and the third switching control transistor T9 are N-type transistors; or, the first switching control transistor T7 is an N-type transistor, and the second switching control transistor T8 and the third switching control transistor T9 are P-type transistors.

Specifically, when the signal input terminal S is input with the fourth signal, the third switching control transistor T9 is turned on; based on this, when the data signal line DL is input with the turn-off signal, if the main driving circuit 10 still outputs the main driving current signal, then a portion of the current output by the main driving circuit 10 flows to the switching control circuit 70, so that a voltage is applied to the switching control circuit 70, and the voltage is applied to the other end of the switching control fusing element FU2 through the turned-on third switching control transistor T9. Thus, voltages on both ends of the switching control fusing element FU2 change, and the switching control fusing element FU2 is fused and interrupted; in this case, the fourth voltage terminal V4 inputs the second signal to the control line CL through the turned-on second switching control transistor T8, so that the light emitting circuit 30 and the standby driving circuit 20 are connected with each other. On this basis, when the scanning signal line SL is input with the scanning signal, the data signal line DL is input with the data signal, and the signal input terminal S is input with the third signal, it can be ensured that the standby driving circuit 20 drives the light emitting circuit 30 to emit light.

When the signal input terminal S is input with the fourth signal, and the data signal line DL is input with the turn-off signal, if the main driving circuit 10 outputs no main driving current signal, then the voltages on both ends of the switching control fusing element FU2 do not vary; and in this case, since the width-to-length ratio of the first switching control transistor T7 is 10 times or more of the width-to-length ratio of the second switching control transistor T8, a resistance of the second switching control transistor T8 is greater than a resistance of the first switching control transistor T7. Based on this, when the fourth voltage terminal V4 is a high voltage terminal (i.e., the second signal is a high voltage signal) and the third voltage terminal V3 is a low voltage terminal, a low voltage signal (i.e., the first signal) may be input to the control line CL, so that the light emitting circuit 30 and the standby driving circuit 20 remain disconnected. Alternatively, when the fourth voltage terminal V4 is a low voltage terminal (i.e., the second signal is a low voltage signal) and the third voltage terminal V3 is a high voltage terminal, a high voltage signal (i.e., the first signal) may be input to the control line CL, so that the light emitting circuit 30 and the standby driving circuit 20 remain disconnected.

Based on this, when the scanning signal line SL is input with the scanning signal, the data signal line DL is input with the data signal, and the signal input terminal S is input with the third signal, the third switching control transistor T9 is turned off, and the voltages on both ends of the switching control fusing element FU2 do not vary; under control of the third voltage terminal V3 and the fourth voltage terminal V4, the first signal is input to the control line CL, and it can be ensured that the main driving circuit 10 drives the light emitting circuit 30 to emit light.

It should be noted that, firstly, when the first switching control transistor T7 is a P-type transistor, and the second switching control transistor T8 and the third switching control transistor T9 are N-type transistors, the third voltage terminal V3 is a low voltage terminal, and the fourth voltage terminal V4 is a high voltage terminal. Based on this, when the switching circuit 60 includes the sixth transistor T6, the sixth transistor T6 is an N-type transistor. When the first signal input to the control line CL is a low voltage signal, the sixth transistor T6 is turned off, so that the light emitting circuit 30 and the standby driving circuit 20 remain disconnected.

When the first switching control transistor T7 is an N-type transistor, and the second switching control transistor T8 and the third switching control transistor T9 are P-type transistors, the third voltage terminal V3 is a high voltage terminal, and the fourth voltage terminal V4 is a low voltage terminal. Based on this, when the switching circuit 60 includes the sixth transistor T6, the sixth transistor T6 is a P-type transistor. When the first signal input to the control line CL is a high voltage signal, the sixth transistor T6 is turned off, so that the light emitting circuit 30 and the standby driving circuit 20 remain disconnected.

For example, when the fusing control circuit 50 includes the fifth transistor T5, a type of the fifth transistor T5 is identical to a type of the third switching control transistor T9.

Secondly, the first fusing element FU1 and the switching control fusing element FU2 may be the same or different.

Thirdly, the switching control circuit 70 may further include a plurality of first switching control transistors T7 connected in parallel, a plurality of second switching control transistors T8 connected in parallel, and/or a plurality of third switching control transistors T9 connected in parallel. The above description is merely illustration of the switching control circuit 70, and other structures that have same functions as those of the switching control circuit 70 will not be described in detail herein, but they should all fall within the protection scope of the present disclosure.

Based on the above description of respective circuits, when the fifth transistor T5, the sixth transistor T6, the second switching control transistor T8 and the third switching control transistor T9 in FIG. 5 are N-type transistors, the other transistors are P-type transistors, the third voltage terminal V3 is a low voltage terminal, and the fourth voltage terminal V4 is a high voltage terminal, an operation process of the pixel circuit as shown in FIG. 5 is described in detail. For example, in an equivalent circuit diagram provided by an embodiment of the present disclosure, a transistor in a turn-off state is marked with "x", and a fusing element in a fused and interrupted state is marked with "x".

Figure 6A:
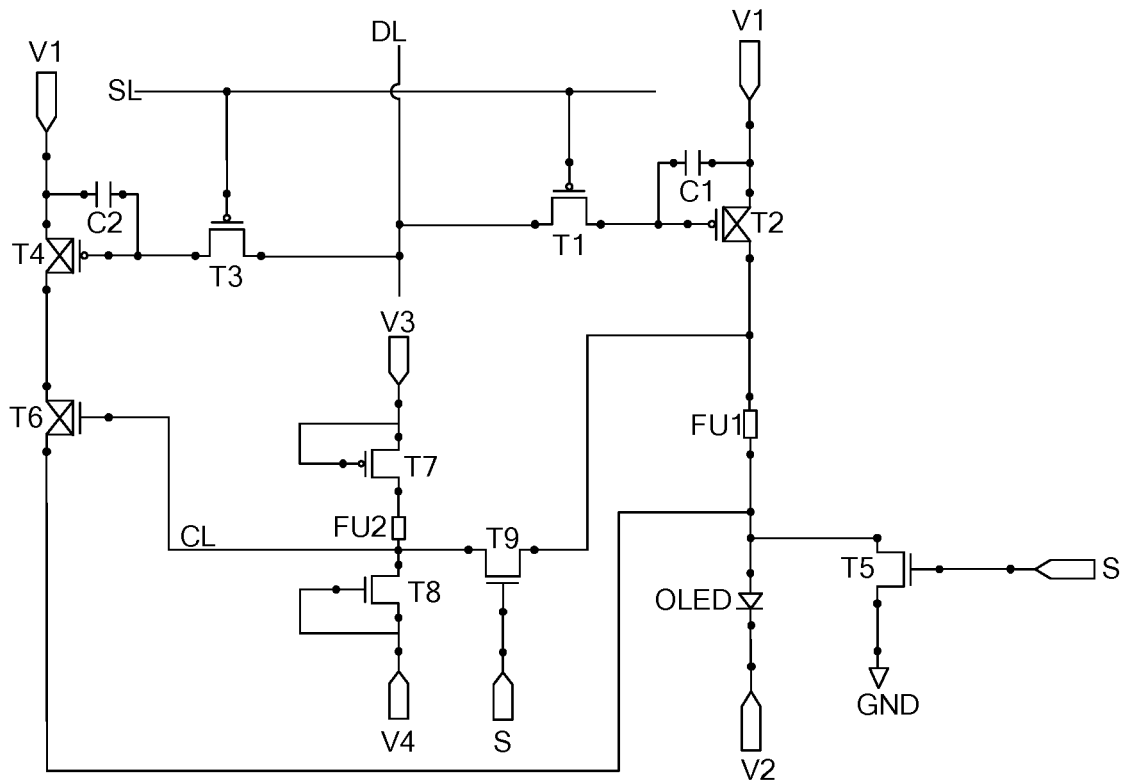
FIG. 6a to FIG. 6d are equivalent circuit diagrams of the pixel circuit shown in FIG. 5 corresponding to different situations.
Figure 7A:
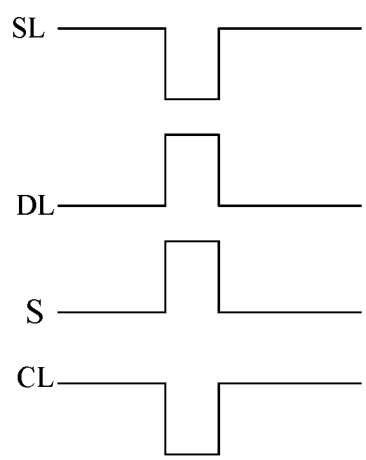
FIG. 7a is a first timing diagram of a pixel circuit during normal operation.

In conjunction with a timing shown in FIG. 7a, when the scanning signal line SL is input with the scanning signal (for example, a low level of the SL in FIG. 7a), and the data signal line DL is input with a turn-off signal (for example, a high level of the DL in FIG. 7a), in a normal situation, as shown in FIG. 6a, the first transistor T1 is turned on, the second transistor T2 is turned off, the third transistor T3 is turned on, and the fourth transistor T4 is turned off; at a same time, the signal input terminal S is input with a bias signal (i.e., the fourth signal, a high level of the S in FIG. 7a), the fifth transistor T5 and the third switching control transistor T9 are turned on; however, since the second transistor T2 outputs no driving current signal, and voltages on both ends of the first fusing element FU1 do not vary, the first fusing element FU1 is not fused, the main driving circuit 10 and the light emitting circuit 30 remain connected; and the voltages on both ends of the switching control fusing element FU2 do not vary either, the switching control fusing element FU2 is not fused, a low voltage signal (i.e., the first signal, the low level of the CL in FIG. 7a) is input to the control line CL, the sixth transistor T6 is turned off, and the standby driving circuit 20 and the light emitting circuit 30 remain disconnected.

Figure 6B:
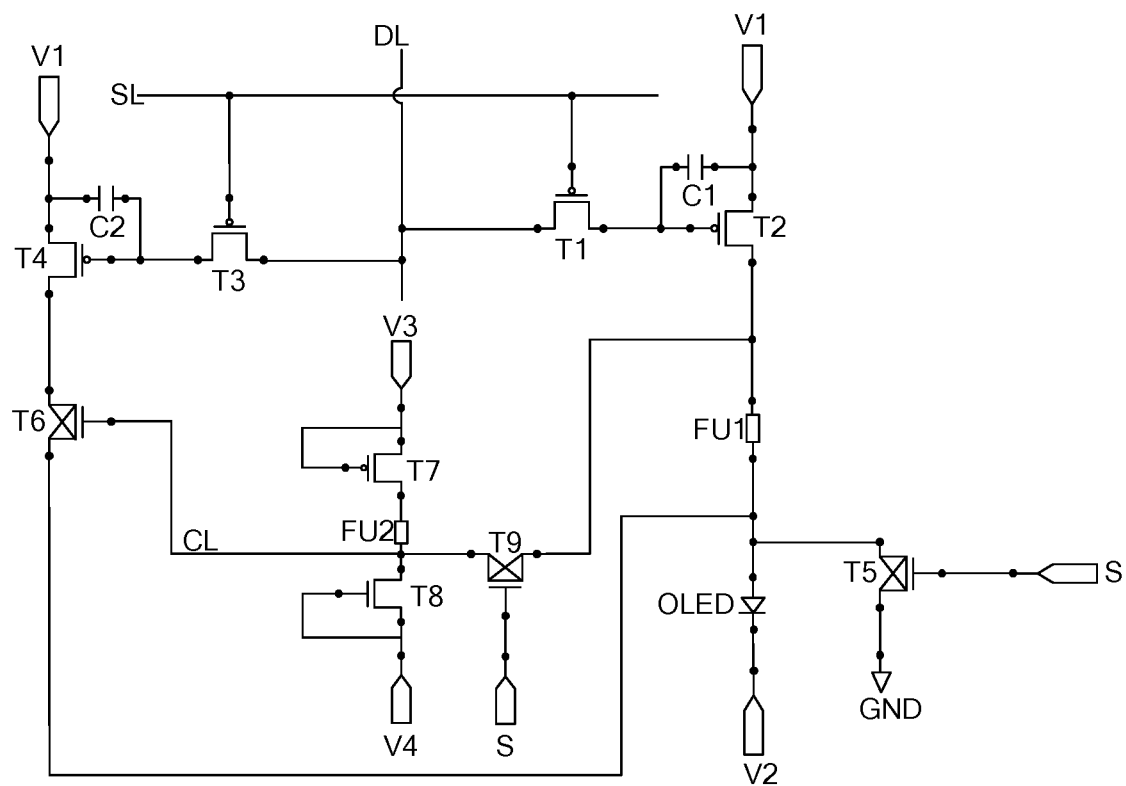

On a basis that the main driving circuit 10 and the light emitting circuit 30 remain connected, and the standby driving circuit 20 and the light emitting circuit 30 remain disconnected, when the scanning signal line SL is input with the scanning signal, and the data signal line DL is input with the data signal, as shown in FIG. 6b, the first transistor T1, the second transistor T2, the third transistor T3 and the fourth transistor T4 are turned on; at a same time, the signal input terminal S is input with the turn-off signal (i.e., the third signal), the fifth transistor T5, the third switching control transistor T9 and the sixth transistor T6 are all turned off, and the second transistor T2 drives the light emitting device to emit light.

When the scanning signal line SL is input with the turn-off signal, and the data signal line DL is input with the data signal, the first transistor T1, the second transistor T2, the third transistor T3 and the fourth transistor T4 are all turned off; and the signal input terminal S is input with the turn-off signal.

Figure 6C:
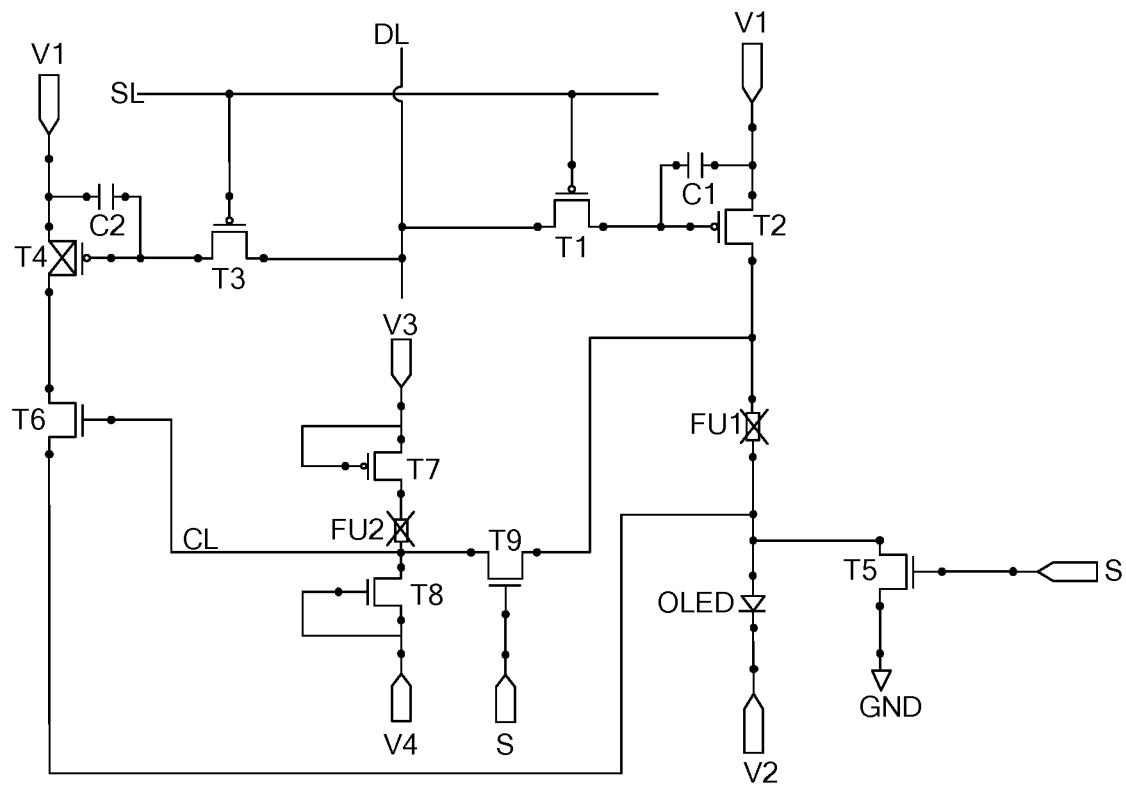

In conjunction with a timing shown in FIG. 7b, when the scanning signal line SL is input with the scanning signal, and the data signal line DL is input with the turn-off signal, if the second transistor T2 is in an approximate turn-on state constantly due to problems related to design and process stability, then as shown in FIG. 6c, the first transistor T1 is turned on, and the second transistor T2 outputs the main driving current signal; at a same time, the signal input terminal S is input with the bias signal (i.e., the fourth signal), and the fifth transistor T5 and the third switching control transistor T9 are turned on, so that the main driving current signal output by the second transistor T2 respectively flows to the ground terminal GND and the third switching control transistor T9. In this case, since the voltages on both ends of the first fusing element FU1 vary, the first fusing element FU1 is fused and interrupted, and the main driving circuit 10 and the light emitting circuit 30 is disconnected from each other; and since the voltages on both ends of the switching control fusing element FU2 also vary, the switching control fusing element FU2 is also fused and interrupted, a high voltage signal (i.e., the second signal, the high level of the CL in FIG. 7b) is input to the control line CL, the sixth transistor T6 is constantly on, and the standby driving circuit 20 and the light emitting circuit 30 are connected. In this case, the turning-on of the sixth transistor T6 is not affected, regardless of whether the signal input terminal S is input with the turn-off signal or the bias signal.

Figure 6D:
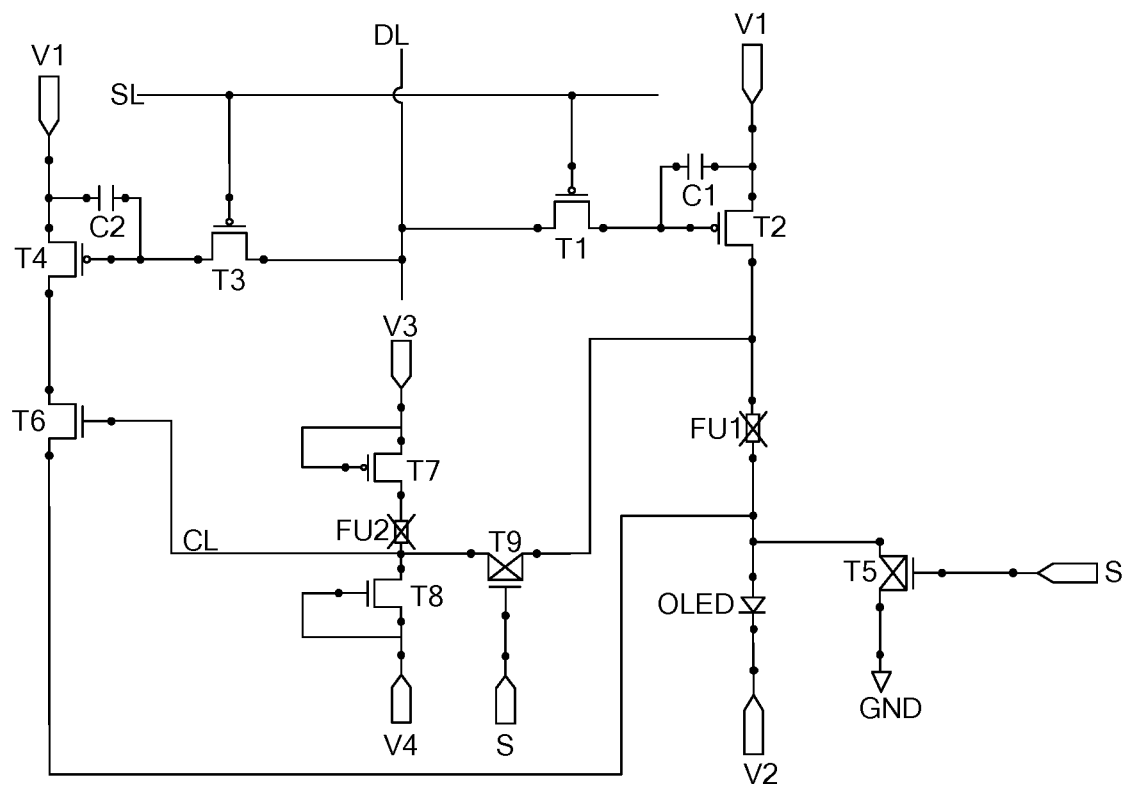

On a basis that the main driving circuit 10 and the light emitting circuit 30 are disconnected from each other, and the standby driving circuit 20 and the light emitting circuit 30 are connected with each other, when the scanning signal line SL is input with the scanning signal, and the data signal line DL is input with the data signal, as shown in FIG. 6d, the first transistor T1, the second transistor T2, the third transistor T3 and the fourth transistor T4 are turned on; at a same time, the signal input terminal S is input with the turn-off signal (i.e., the third signal), the fifth transistor T5 and the third switching control transistor T9 are turned off, and the fourth transistor T4 drives the light emitting device to emit light.

When the scanning signal line SL is input with the turn-off signal, and the data signal line DL is input with the data signal, the first transistor T1, the second transistor T2, the third transistor T3 and the fourth transistor T4 are all turned off, and the signal input terminal S is input with the turn-off signal.

It should be noted that, except the second transistor T2 and the fourth transistor T4 (i.e., the driving transistors), the first electrode and the second electrode of the remaining transistors are not limited in the embodiments of the present disclosure, the first electrode may be a drain electrode, and the second electrode may be a source electrode; or the first electrode may be a source electrode and the second electrode may be a drain electrode. When the driving transistor is a P-type transistor, since in the P-type transistor, a source electrode voltage is higher than a drain electrode voltage, the first electrode of the driving transistor is the source electrode, and the second electrode is the drain electrode. When the driving transistor is an N-type transistor, the situation is just opposite to that of the P-type transistor.

An embodiment of the present disclosure further provides a display device, comprising any one of the pixel circuits as described above.

Taking into account that a silicon-based OLED display device has a relatively high resolution, with its pixels prone to an always-on defect, the display device is an OLED display device.

The display device according to an embodiment of the present disclosure has same advantages as those of the pixel circuit provided by the foregoing embodiments of the present disclosure; since the pixel circuit has been described in detail in the foregoing embodiments, the details will not be described here again.

An embodiment of the present disclosure further provides a driving method of a pixel circuit, for driving any one of the pixel circuits as described above, and as shown in FIG. 8, the method comprises:

S10: when testing the pixel circuit, inputting a scanning signal to a scanning signal line SL, inputting a turn-off signal to a data signal line DL, and inputting a fourth signal to a signal input terminal S, so that when a main driving circuit 10 outputs a main driving current signal, a light emitting circuit 30 and the main driving circuit 10 are disconnected from each other.

For example, the fourth signal may be a bias signal.

Here, if the pixel circuit has an always-on defect, the main driving current signal, which is output from the main driving circuit 10 to a fusing circuit 40, flows to a ground terminal GND, and the light emitting circuit 30 and the main driving circuit 10 are disconnected from each other. If the pixel circuit has no always-on defect, then even if the signal input terminal S is input with a fourth signal, since the main driving circuit 10 does not output any driving current signal, the light emitting circuit 30 and the main driving circuit 10 are still connected via the fusing circuit 40.

S20: if the emitting circuit 30 and the main driving circuit 10 are disconnected from each other, inputting a second signal to the control line CL, so that the light emitting circuit 30 and the standby driving circuit 20 are connected with each other; and if the light emitting circuit 30 and the main driving circuit 10 still remain connected, inputting a first signal to the control line CL, so that the light emitting circuit 30 and the standby driving circuit 20 remain disconnected.

S30: during normal operation of the pixel circuit, inputting the scanning signal to the scanning signal line SL, inputting a data signal to the data signal line DL, and inputting a third signal to the signal input terminal S, so that the main driving current signal output by the main driving circuit 10 or the standby driving current signal output by the standby driving circuit 20 drives the light emitting circuit 30 to emit light.

For example, the third signal may be the turn-off signal. For example, the turn-off signal is a signal that may enable a related transistor to be turned off.

Here, when the standby driving current signal output by the standby driving circuit 20 drives the light emitting circuit 30 to emit light, the second signal is continuously input to the control line CL; and when the main driving current signal output by the main driving circuit 10 drives the light emitting circuit 30 to emit light, the first signal is continuously input to the control line CL.

An embodiment of the present disclosure provides the driving method of the pixel circuit; by inputting the scanning signal to the scanning signal line SL, and inputting the turn-off signal to the data signal line DL, and under control of the signal input terminal S, if the pixel circuit has the always-on defect, then the driving current signal, which is output from the main driving circuit 10 to the fusing circuit 40, flows to the ground terminal GND, and the light emitting circuit 30 and the main driving circuit 10 are disconnected from each other, so that the problem of the always-on defect can be solved. If the pixel circuit has no always-on defect, when the data signal line DL is input with the turn-off signal, the main driving circuit 10 does not output any driving current signal, the light emitting circuit 30 and the main driving circuit 10 remain connected, and then the main driving circuit 10 still drives the light emitting circuit 30 to emit light. On this basis, if the pixel circuit has the always-on defect, the light emitting circuit 30 and the main driving circuit 10 are disconnected from each other, and the light emitting circuit 30 may be connected with the standby driving circuit 20 under control of the control line CL, so that the standby driving circuit 20 drives the light emitting circuit 30 to emit light. Therefore, when the pixel circuit operates normally, the scanning signal line SL is input with the scanning signal, and the data signal line DL is input with the data signal; and the main driving current signal output by the main driving circuit 10 or the standby driving current signal output by the standby driving circuit 20 may drive the light emitting circuit 30 to emit light. Based on this, it can be seen that, in embodiments of the present disclosure, pixels are not damaged on the basis that the problem of the always-on defect is solved, and in addition, an objective of repairing the pixel is achieved, which prevents the always-on defect from affecting the product quality and yield rate.

For example, inputting the first signal or the second signal to the control line CL, includes: under control of the third voltage terminal V3 and the fourth voltage terminal V4, when the signal input terminal S is input with the fourth signal, inputting, by a switching control circuit 70, the second signal to the control line CL if the pixel circuit has the always-on defect, and otherwise, inputting, by the switching control circuit 70, the first signal to the control line CL; when the signal input terminal S is input with the third signal, inputting, by the switching control circuit 70, the second signal to the control line CL if the light emitting circuit 30 and the main driving circuit 10 are disconnected from each other, and otherwise, inputting, by the switching control circuit 70, the first signal to the control line CL.

In this way, when the signal input terminal S is input with the fourth signal, if the fusing circuit 40 enables the light emitting circuit 30 and the main driving circuit 10 to be disconnected from each other, then, under the control of the third voltage terminal V3 and the fourth voltage terminal V4, and under an action of the main driving circuit 10, the second signal is input to the control line CL, which achieves an objective that when the light emitting circuit 30 and the main driving circuit 10 are disconnected from each other, the light emitting circuit 30 and the standby driving circuit 20 are automatically made to be connected with each other; and when the signal input terminal S is input with the fourth signal, it does not affect the fusing circuit 40, or when the signal input terminal S is input with the third signal, normal operation of the pixel circuit can be ensured.

In the present disclosure, terms such as "first", "second" and the like used in the present disclosure do not indicate any sequence, quantity or significance but only for distinguishing different constituent parts. Also, the terms such as "a," "an," or "the" etc., are not intended to limit the amount, but indicate the existence of at least one. The terms "comprises," "comprising," "includes," "including," etc., are intended to specify that the elements or the objects stated before these terms and encompass the elements or the objects and equivalents thereof listed after these terms, but do not preclude the other elements or objects.

Unless otherwise clearly defined and limited, terms such as "installed", "coupled", "connected" should be broadly interpreted, for example, it may be fixedly connected, or may be detachably connected, or integrally connected; it may be mechanically connected, or may be electrically connected; it may be directly connected, or may be indirectly connected via an intermediate medium. Those skilled in the art can understand the specific meanings of the above-mentioned terms in the embodiments of the present disclosure according to the specific circumstances.

Obviously, those skilled in the art may modify the disclosure in various ways without breaking away from the spirits and scope of the disclosure. And so, if these changes and variations of the disclosure also fall within the scope of the claims or their equivalent technologies, the disclosure intends to include these changes and variations.

What are described above is related to the illustrative embodiments of the disclosure only and not limitative to the scope of the disclosure; any changes or replacements easily for those technical personnel who are familiar with this technology in the field to envisage in the scopes of the disclosure, should be in the scope of protection of the present disclosure. Therefore, the scopes of the disclosure are defined by the accompanying claims.

The invention claimed is:

1. A pixel circuit, comprising: a main driving circuit, a standby driving circuit, a light emitting circuit, a fusing circuit, a fusing control circuit, and a switching circuit; wherein:

the main driving circuit is respectively connected with a scanning signal line, a data signal line, a first voltage terminal and the fusing circuit, and is configured to, under control of the scanning signal line and the data signal line, convert a voltage signal input by the first voltage terminal into a main driving current signal, and output the main driving current signal to the fusing circuit;

the fusing circuit is further connected with the fusing control circuit and the light emitting circuit, and is configured to, under control of the fusing control circuit, enable the light emitting circuit and the main driving circuit to be disconnected from each other;

the fusing control circuit is further connected with a signal input terminal and a ground terminal, and is configured to, under control of the signal input terminal, enable the main driving current signal, which is output from the main driving circuit to the fusing circuit, to flow to the ground terminal, so that the light emitting circuit and the main driving circuit are disconnected from each other;

the standby driving circuit is respectively connected with the scanning signal line, the data signal line, the first voltage terminal and the switching circuit, and is configured to, under control of the scanning signal line and the data signal line, convert the voltage signal input by the first voltage terminal into a standby driving current signal, and output the standby driving current signal to the switching circuit;

the switching circuit is further connected with the light emitting circuit and a control line, and is configured to, under control of an input signal of the control line, connect the standby driving circuit to the light emitting circuit; and the light emitting circuit is further connected with a second voltage terminal, and is configured to, under control of the second voltage terminal, emit light by using the standby driving current signal output by the standby driving circuit when the light emitting circuit and the main driving circuit are disconnected from each other.

2. The pixel circuit according to claim 1, wherein the light emitting circuit is further configured to: under the control of the second voltage terminal, emit light via the main driving current signal output by the main driving circuit before the light emitting circuit and the main driving circuit are disconnected from each other.

3. The pixel circuit according to claim 2, further comprising a switching control circuit, respectively connected with the control line, the main driving circuit, the fusing circuit, a third voltage terminal, a fourth voltage terminal and the signal input terminal, wherein the switching control circuit is configured to, under control of the third voltage terminal, the fourth voltage terminal and the signal input terminal: input the second signal to the control line when the fusing circuit enables the light emitting circuit and the main driving circuit to be disconnected from each other, so that the light emitting circuit and the standby driving circuit are connected with each other; otherwise, input the first signal to the control line when the light emitting circuit and the standby driving circuit remain disconnected.

4. The pixel circuit according to claim 2, wherein the main driving circuit includes a first transistor, a second transistor and a first storage capacitor;

a gate electrode of the first transistor is connected with the scanning signal line, a first electrode is connected with the data signal line, and a second electrode is connected with a gate electrode of the second transistor;

a first electrode of the second transistor is connected with the first voltage terminal, and a second electrode is connected with the fusing circuit;

one end of the first storage capacitor is connected with the gate electrode of the second transistor, another end of the first storage capacitor is connected with the second electrode of the second transistor, or, the other end of the first storage capacitor is connected with the first electrode of the second transistor.

5. The pixel circuit according to claim 2, wherein the standby driving circuit includes a third transistor, a fourth transistor and a second storage capacitor;

a gate electrode of the third transistor is connected with the scanning signal line, a first electrode is connected with the data signal line, and a second electrode is connected with a gate electrode of the fourth transistor;

a first electrode of the fourth transistor is connected with the first voltage terminal, and a second electrode is connected with the switching circuit;

one end of the second storage capacitor is connected with the gate electrode of the fourth transistor, another end of the second storage capacitor is connected with the second electrode of the fourth transistor, or, the other end of the second storage capacitor is connected with the first electrode of the fourth transistor.

6. The pixel circuit according to claim 2, wherein the fusing circuit includes a first fusing element;

one end of the first fusing element is connected with the main driving circuit, and another end of the first fusing element is connected with both the light emitting circuit and the fusing control circuit.

7. The pixel circuit according to claim 2, wherein the fusing control circuit includes a fifth transistor;

a gate electrode of the fifth transistor is connected with the signal input terminal, a first electrode is connected with the fusing circuit, and a second electrode is connected with the ground terminal.

8. The pixel circuit according to claim 2, wherein the switching circuit includes a sixth transistor;

a gate electrode of the sixth transistor is connected with the control line, a first electrode is connected with the standby driving circuit, and a second electrode is connected with the light emitting circuit.

9. The pixel circuit according to claim 2, wherein the light emitting circuit includes a light emitting device;

an anode of the light emitting device is connected with both the fusing circuit and the switching circuit, and a cathode is connected with the second voltage terminal.

10. The pixel circuit according to claim 1 or 2, further comprising a switching control circuit, respectively connected with the control line, the main driving circuit, the fusing circuit, a third voltage terminal, a fourth voltage terminal and the signal input terminal, wherein the switching control circuit is configured to, under control of the third voltage terminal, the fourth voltage terminal and the signal input terminal: input the second signal to the control line when the fusing circuit enables the light emitting circuit and the main driving circuit to be disconnected from each other, so that the light emitting circuit and the standby driving circuit are connected with each other; otherwise, input the first signal to the control line when the light emitting circuit and the standby driving circuit remain disconnected.

11. The pixel circuit according to claim 10, wherein the switching control circuit includes a first switching control transistor, a second switching control transistor, a third switching control transistor, and a switching control fusing element;

a gate electrode and a first electrode of the first switching control transistor are connected with the third voltage terminal, and a second electrode is connected with one end of the switching control fusing element;

another end of the switching control fusing element is connected with both a first electrode of the second switching control transistor and the control line;
a gate electrode and a second electrode of the second switching control transistor are both connected with the fourth voltage terminal;
a gate electrode of the third switching control transistor is connected with the signal input terminal, a first electrode is connected with the first electrode of the second switching control transistor, and a second electrode is connected with both the main driving circuit and the fusing circuit;
a width-to-length ratio of the first switching control transistor is 10 times or more of a width-to-length ratio of the second switching control transistor; and
the first switching control transistor and the second switching control transistor are constantly on, the first switching control transistor is a P-type transistor, the second switching control transistor and the third switching control transistor are N-type transistors; or, the first switching control transistor is an N-type transistor, and the second switching control transistor and the third switching control transistor are P-type transistors.

12. The pixel circuit according to claim 1, wherein the main driving circuit includes a first transistor, a second transistor and a first storage capacitor;
a gate electrode of the first transistor is connected with the scanning signal line, a first electrode is connected with the data signal line, and a second electrode is connected with a gate electrode of the second transistor;
a first electrode of the second transistor is connected with the first voltage terminal, and a second electrode is connected with the fusing circuit;
one end of the first storage capacitor is connected with the gate electrode of the second transistor, another end of the first storage capacitor is connected with the second electrode of the second transistor, or, the other end of the first storage capacitor is connected with the first electrode of the second transistor.

13. The pixel circuit according to claim 1, wherein the standby driving circuit includes a third transistor, a fourth transistor and a second storage capacitor;
a gate electrode of the third transistor is connected with the scanning signal line, a first electrode is connected with the data signal line, and a second electrode is connected with a gate electrode of the fourth transistor;
a first electrode of the fourth transistor is connected with the first voltage terminal, and a second electrode is connected with the switching circuit;
one end of the second storage capacitor is connected with the gate electrode of the fourth transistor, another end of the second storage capacitor is connected with the second electrode of the fourth transistor, or, the other end of the second storage capacitor is connected with the first electrode of the fourth transistor.

14. The pixel circuit according to claim 1, wherein the fusing circuit includes a first fusing element;
one end of the first fusing element is connected with the main driving circuit, and another end of the first fusing element is connected with both the light emitting circuit and the fusing control circuit.

15. The pixel circuit according to claim 1, wherein the fusing control circuit includes a fifth transistor;
a gate electrode of the fifth transistor is connected with the signal input terminal, a first electrode is connected with the fusing circuit, and a second electrode is connected with the ground terminal.

16. The pixel circuit according to claim 1, wherein the switching circuit includes a sixth transistor;
a gate electrode of the sixth transistor is connected with the control line, a first electrode is connected with the standby driving circuit, and a second electrode is connected with the light emitting circuit.

17. The pixel circuit according to claim 1, wherein the light emitting circuit includes a light emitting device;
an anode of the light emitting device is connected with both the fusing circuit and the switching circuit, and a cathode is connected with the second voltage terminal.

18. A display device, comprising the pixel circuit according to claim 1.

19. A driving method of a pixel circuit, for driving the pixel circuit according to claim 1, comprising:
when testing the pixel circuit, inputting a scanning signal to a scanning signal line, inputting a turn-off signal to a data signal line, and inputting a fourth signal to a signal input terminal, so that when a main driving circuit outputs a main driving current signal, a light emitting circuit and the main driving circuit are disconnected from each other;
if the emitting circuit and the main driving circuit are disconnected from each other, inputting a second signal to the control line, so that the light emitting circuit and the standby driving circuit are connected with each other; and if the light emitting circuit and the main driving circuit remain connected, inputting a first signal to the control line, so that the light emitting circuit and the standby driving circuit remain disconnected;
during normal operation of the pixel circuit, inputting the scanning signal to the scanning signal line, inputting a data signal to the data signal line, and inputting a third signal to the signal input terminal, so that the main driving current signal output by the main driving circuit or the standby driving current signal output by the standby driving circuit drives the light emitting circuit to emit light.

20. The driving method according to claim 19, wherein inputting the first signal or the second signal to the control line, includes:
under control of a third voltage terminal and a fourth voltage terminal, when the signal input terminal is input with the fourth signal, inputting, by a switching control circuit, the second signal to the control line if the pixel circuit has an always-on defect, otherwise, inputting, by the switching control circuit, the first signal to the control line; and
when the signal input terminal is input with the third signal, inputting, by the switching control circuit, the second signal to the control line if the light emitting circuit and the main driving circuit are disconnected from each other, otherwise, inputting, by the switching control circuit, the first signal to the control line.

* * * * *